United States Patent [19]

Rigney

[11] Patent Number: 5,221,354
[45] Date of Patent: Jun. 22, 1993

[54] APPARATUS AND METHOD FOR GAS PHASE COATING OF HOLLOW ARTICLES

[75] Inventor: David V. Rigney, Cincinnati, Ohio

[73] Assignee: General Electric Company, Cincinnati, Ohio

[21] Appl. No.: 787,466

[22] Filed: Nov. 4, 1991

[51] Int. Cl.⁵ .............................................. C23C 16/00
[52] U.S. Cl. ................................... 118/725; 118/715; 118/726; 118/733
[58] Field of Search ............... 118/715, 725, 726, 733

[56] References Cited

U.S. PATENT DOCUMENTS

| | | | |
|---|---|---|---|
| 3,486,927 | 12/1969 | Gauje | 117/107.2 |
| 3,783,007 | 1/1974 | Bloom et al. | 117/95 |
| 4,132,816 | 1/1979 | Benden et al. | 427/237 |
| 4,148,275 | 4/1979 | Benden et al. | 118/49.5 |
| 4,271,005 | 6/1981 | Wright et al. | 204/298 |
| 4,347,267 | 8/1982 | Baldi | 427/237 |

Primary Examiner—Richard Bueker
Attorney, Agent, or Firm—Carmen Santa Maria; Jerome C. Squillaro

[57] ABSTRACT

Apparatus and method for simultaneously coating interior and exterior surfaces of articles, such as advanced turbine airfoils, the interior surfaces defined by narrow, complex passageways. The apparatus and method, in addition to providing for simultaneous coating of interior and exterior surfaces, also permits additional control over the coating process by permitting control over the partial pressure of reactive gas introduced into the reaction chamber. The apparatus also permits for subsequent thermal treatment of the coated parts in an inert gas atmosphere with no intermediate cooling step thereby reducing costs while eliminating the potential for damage due to handling by the elimination of at least one handling operation.

19 Claims, 3 Drawing Sheets

APPARATUS AND METHOD FOR GAS PHASE COATING OF HOLLOW ARTICLES

BACKGROUND OF THE INVENTION

This invention relates to application of a coating to an article, and more particularly, to apparatus and an improved method for applying an aluminide coating simultaneously to the interior and exterior of an article.

The aluminizing process is well-known in the art. The process is used to apply an aluminide coating to substrates, such as nickel-base superalloy articles. Some of these articles require a coating on both external surfaces and on internal surfaces. For some articles, such as turbine airfoils, the internal surfaces are complex and accessible only through narrow, restricted passageways.

Improved turbine engines have resulted in the need for improved methods for coating the turbine airfoils. The internal surfaces of advanced turbine hardware are now subjected to such elevated temperatures that uncoated portions of such hardware are oxidized in service. As the oxide scale is formed in these narrow, serpentine passageways, a thickened scale grows from the surface, resulting in a narrowing of the passageway, which in turn reduces the effectiveness of the cooling air. The result is that the degradation process proceeds an ever-increasing rate. This accelerated oxidation process can be stopped only by effectively coating the entire interior passageway of the part.

Several methods currently exist for coating the interior and the exterior surfaces of articles, such as turbine airfoils. Each has limitations which may add significantly to the cost and time required to process the articles, or which may result in a failure to adequately coat the internal surfaces.

One of the methods currently used to coat articles is a pack diffusion process. In this process, the surfaces of the articles to be coated are embedded in a source of finely divided particles including an aluminum source, a volatile halide to act as a chemical transfer medium for the aluminum, and a ceramic phase, such as alumina powder, to prevent the agglomeration of the metallic components, and heated to an elevated temperature, usually at least 1200° F., all within a retort. Among the problems encountered is the accumulation of powdered particles in the narrow passages or openings of the parts prevents the flow of the aluminum gas through the narrow serpentine passageways. The result is a lack of a coating in the blocked passageways. Even in openings which are not blocked, it has been observed that the coating thickness tends to be thicker at or near the opening, and decreases rapidly with increasing distance from the opening. This nonuniform coating frequently results on unacceptable airfoils.

Another method used to coat articles is referred to as an over the pack process, such as described in Benden, U.S. Pat. No. 4,132,816 dated Jan. 2, 1979. This process is a simple modification of the pack process, in that the parts to be processed are suspended over the powdered material rather than embedded in the powdered material. In order to deposit the gaseous aluminum, produced by the elevated temperature decomposition of aluminum in the presence of the halide activator, onto the suspended parts, an inert gas is introduced into the retort and passed over the surfaces to be coated. This process is an improvement over pack processes since no powder mixture is contact with the surfaces, and hence cannot block the openings to the narrow passageways. Although an improvement for coating internal passageways as compared to pack processing, the only control over the deposition rate as the reaction proceeds is control over the argon gas pressure and modification of the reaction temperature and time at temperature. However, such a system lacks control over the coating of the internal passageways.

In a modification of this method described in Benden, U.S. Pat. No. 4,148,275 dated Apr. 10, 1979, the retort has two chambers for effecting simultaneous coating of the exterior and the interior portions of the article. Each chamber has separate powder mixtures. The improvement allows better control of the coating of the internal passageways by controlling the flow rate of the carrier gas into the chamber which contains the aluminum source, the inert filler and the metal halide. This control is in addition to control available through variations in temperature and time.

Another method of applying a coating to articles having narrow, serpentine passageways, such as turbine airfoils, is chemical vapor deposition, also referred to as CVD. In CVD, the part to be coated is placed in a retort. An aluminum-bearing gas is generated at an elevated temperature in a reaction chamber outside of the retort, typically by reacting an aluminum source with an activator gas, such as a halide. The aluminum halide gas is then transported from the reaction chamber to the retort by an inert carrier gas. The aluminum halide gas then reacts at the surface of the article, depositing an aluminide coating. The resultant, halide-bearing gas is exhausted from the retort. Complex fixturing and redundant equipment for internal and external coating is required to assure that the appropriate coating thickness is deposited on the internal surfaces of the parts as well as the external surface of the parts. This makes an expensive process even more costly.

There therefore exists a need for improved apparatus and improved processing methods for applying, in a cost-effective manner, a coating simultaneously and in a controlled fashion to articles requiring coating on interior and exterior surfaces.

SUMMARY OF THE INVENTION

The present invention provides an improved apparatus and method for depositing a coating on a plurality of articles. Each article has at least one internal passage having an internal surface which extends from a first surface of the article to a second surface of the article. Both the internal surface and at least one external surface of the article are coated with a coating gas which simultaneously coats the surface or surfaces of each internal passageway and external surface or surfaces.

The apparatus is comprised of a base plate, a retort bell which seats on the base plate, and a seal between the base plate and the retort bell. The interior of the bell and the base plate form an interior chamber of the retort bell, while the seal isolates the interior chamber from the external atmosphere. The articles to be coated are loaded into the interior chamber of this retort bell.

Within the interior chamber, there is positioned at least one substantially cylindrical article holder. This cylinder holder has an interior volume defined by a first radius, $r_1$, which locates the inner or first side of the circumferential wall of the article holder. The outer or second side of the article holder is defined by a second radius, $r_2$, where $r_2$ is greater than $r_1$. This cylindrical wall further has a plurality of apertures for positioning holding the articles within the article holders in a fixed position. The aperture is sized to permit an article to be inserted into it. Means for sealing any space between the circumferential wall and articles positioned within the apertures of the circumferential wall is provided to assist in isolating the interior volume of the article holder from the remaining interior chamber of the retort bell and to minimize leakage across this boundary. Although the top cap of the cylindrical article holder may be integral with the circumferential wall, such as by welding the top cap in place, it may also be a separate, removable item provided that a seal is provided at the junction between the top cap and the cylindrical wall to prevent leakage between the interior volume of the article holder and the exterior of the article holder within the interior chamber of the retort bell.

A gas inlet pipe extends into the interior chamber of the retort bell and may be positioned on either side of the article holder. The opposite end of the inlet pipe is connected to a gas source. A gas outlet pipe for exhausting gases from the interior chamber, which is positioned on the opposite side of the circumferential wall of the cylindrical article holder from the gas inlet pipe extends from the interior chamber. This outlet pipe may conveniently run the exhaust gases to a scrubber system.

A metallic source of material in a single reaction bed, such as a column of metallic pellets or powder, is positioned within the retort bell interior chamber. This source of material should be positioned between the gas inlet pipe and the circumferential wall of the substantially cylindrical article holder, so that inlet gas from the gas inlet pipe flows over the metallic source of material.

The apparatus allows for the coating of a plurality of articles, each article having an interior surface and an exterior surface. The interior surface and the exterior surface of each article is coated substantially simultaneously. The method for applying the coating comprises loading the articles to be coated into a retort bell, having the single reaction bed of metallic material. The articles are loaded and sealed within the cylindrical article holder so that the interior cavities of the articles form a passageway from one side of the cylindrical article holder to its opposite side. Then, after the retort bell is sealed, the retort bell is purged of air by introducing an inert gas through the gas inlet pipe, thereby establishing a substantially inert gas atmosphere within the retort bell.

The retort bell is then heated to an elevated, preselected temperature while maintaining the inert gas atmosphere within the retort bell. The temperature may vary depending on the type and thickness of required metallic coating. Upon reaching the preselected temperature, a reactive halide gas is introduced into the retort bell through the gas inlet pipe. The reactive halide gas comes into contact with the reaction bed of metallic material located between the gas inlet pipe and the circumferential wall of the article holder which holds the articles to be coated. At the preselected, elevated temperature, as the reactive halide gas contacts the reaction bed, a metallic halide gas is formed.

The metallic halide gas is flowed over the surfaces of the articles to be coated. As the metallic halide gas flows over the surfaces, it is reduced, depositing a metallic coating onto the surfaces, thereby coating it. The gas first coats the surfaces on the same side of the holder as the metallic source, but is then passed through the passageway formed by the article internal cavity to the opposite side of the article holder circumferential wall, where it deposits a coating on the surfaces of the article located on the opposite side of the wall. Of course, as it traverses through the internal portions of the article, metallic coating is deposited on the internal surfaces.

The rate of reduction of the metallic halide gas on the article surface is readily controlled by regulating the introduction of reactive halide gas through the gas inlet pipe into the chamber formed by the retort bell. By controlling this flow rate, the rate of formation of metallic halide gas is controlled, the reduction of the metallic halide gas at the article surface is controlled, and hence the coating thickness is controlled.

An advantage of the present invention is that parts of varying design may be loaded into the article holder and coated at the same time.

Another advantage is that only a single metallic source is required for coating both the internal and the external surfaces of hollow articles. Further, there is no need to blend a mass of pack powder as in prior art methods. The need to replenish the metallic source is readily determinable by visually inspecting the reaction bed, which is readily removable, for its depletion.

A major advantage of the present invention is that the coating process can be controlled not only by varying the temperature and the inert gas pressure, but also by varying the amount of reactive halide gas introduced into the retort.

Still another advantage of the present invention is that the coated articles may be heat treated within the retort bell by stopping the flow of reactive halide gas and heating the articles within the retort bell to the required preheat temperature, thereby eliminating the need to cool the parts, remove them form the coating source and reheat them and reducing the handling and potential for damage, as well as reducing costs by elimination of a heating cycle.

Other features and advantages of the invention will be more apparent from the following more detailed description of the preferred embodiment, taken in conjunction with the accompanying drawings, which illustrate, by way of example, the principles of the invention.

DETAILED DESCRIPTION OF THE PREFERRED EMBODIMENTS

A preferred application of the apparatus of the present invention is for coating hollow turbine airfoils, such as turbine blades and vanes. The interior passages of such articles are narrow and serpentine, but because of increasing service temperatures in more demanding applications, require uniform coating thicknesses in order to prevent oxidation without impairing airflow through the narrow passages. The present invention provides a cost-effective method and apparatus for applying a uniform protective coating to both the external surfaces and the surfaces of the narrow, internal passages of such articles.

Figure 1:
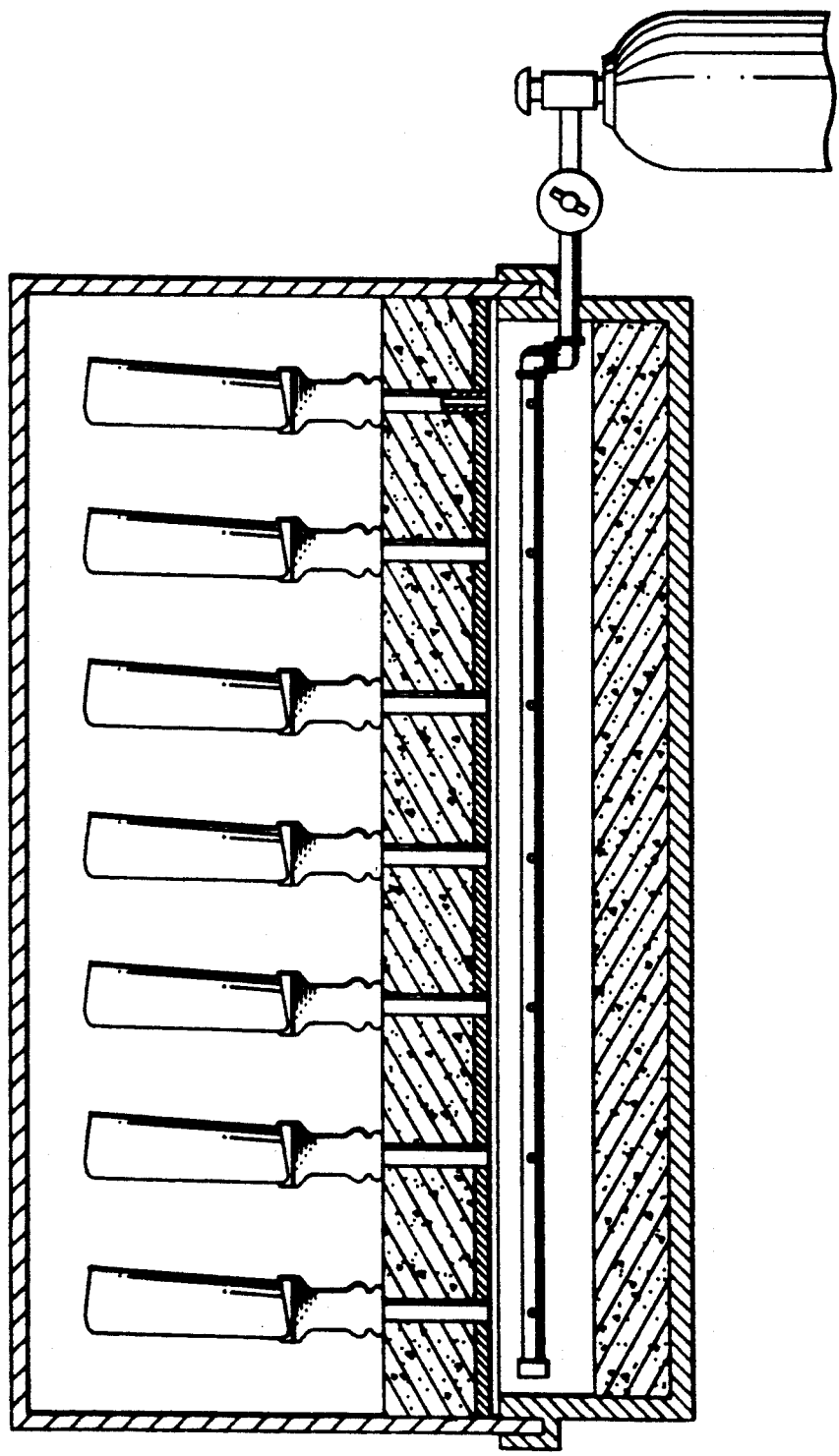
FIG. 1 is a schematic view of a typical prior art apparatus.

Typical prior art methods and apparatus for coating such articles are shown in FIG. 1. Such apparatus typically suspend the airfoils over a pack mixture containing a metal source, inert filler and an activator. In the arrangement shown in FIG. 1, the airfoils are suspended over two isolated chambers, each having a pack mixture. One chamber is used for coating the internal, hollow portion of the blades and the remaining chamber is used to coat the external surfaces of the blades. After the apparatus has been heated to a sufficient temperature to cause the activator and metal to form a metal halide gas, an inert gas is introduced into the chamber used for coating the internal portion of the blades to force the metal halide gas through the narrow passages.

Figure 2:
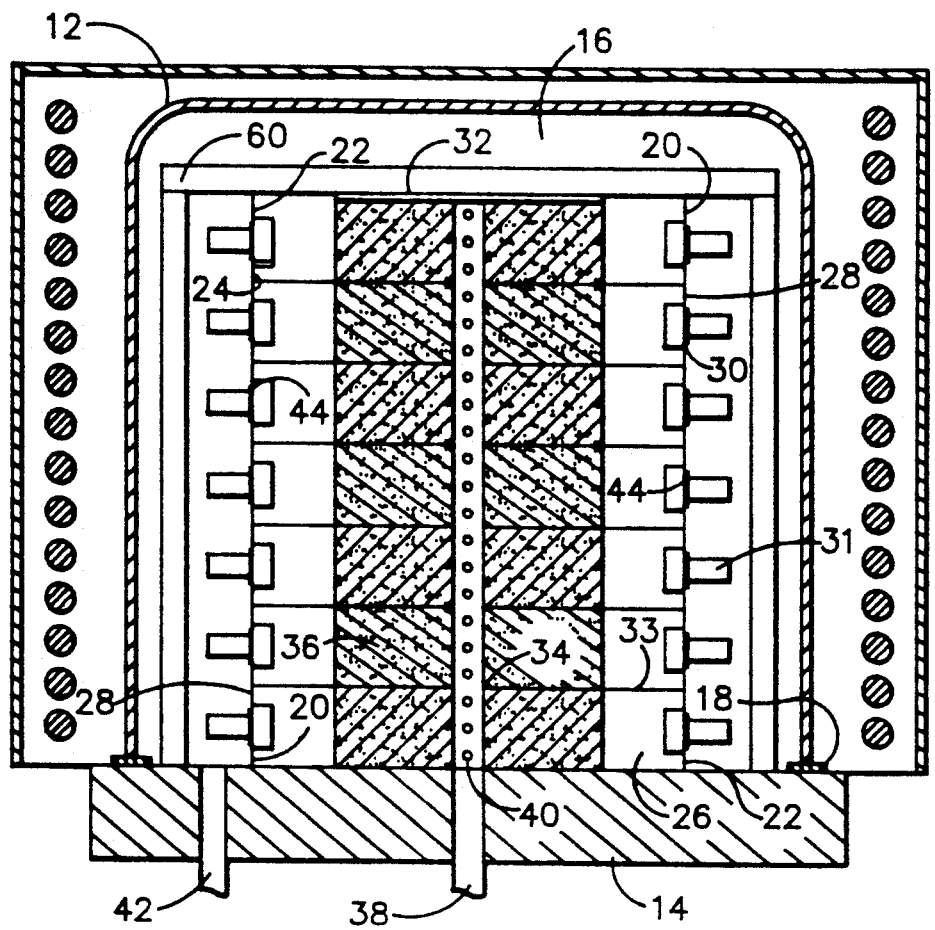
FIG. 2 is a schematic view of the apparatus of the present invention having the metallic source positioned within the interior volume of the cylindrical article holder.

Referring now to FIG. 2, a retort bell 12 is seated on a base plate 14. The interior of the retort bell 12 and the base plate form an interior chamber 16. A seal 18 is positioned between retort bell 12 and base plate 14 to prevent leakage into interior chamber 16. At least one substantially cylindrical article holder 20 is positioned within interior chamber 16. A plurality of article holders 20 may be stacked one over the other, to increase the quantity of parts to be coated and the efficiency of the process, as desired. Each article holder has a circumferential wall 22 having two sides. The first side 24, or inner wall, is defined by a first radius $r_1$ and forms an interior volume 26 within the substantially cylindrical article holder. The second side 28, or exterior wall, is defined by a second radius $r_2$, where $r_2$ is greater than $r_1$, and forms the exterior of cylindrical article holder circumferential wall 22. Circumferential wall 22 also has a plurality of apertures 30 for holding articles 31 in a fixed position while the articles 31 are being coated.

Article holders 20 are tooling designed to be used with different articles. Holders 20 therefore are article specific. Apertures 30 on a specific article holder 20 are of a preselected size to receive an article 31. The size required will depend on the size of the article 31.

In a preferred embodiment, article holder 20 positioned at the opposite end of a plurality of stacked article holders from base plate 14 has a removable top seal cap 32. The purpose of top seal cap 32 is to seal interior volume 26 from leakage to or from the remainder of interior chamber 16. In this arrangement each of the remaining article holders 20 has an optional intermediate cap 33 having a central aperture 34.

In one embodiment, a metallic source 36 comprising finely divided metallic material, preferably aluminum powder or pellets, is positioned within interior volume 26 extending from base plate 14 to top seal cap 32. A gas inlet pipe 38 enters interior volume 26 through base plate 14. Inlet pipe extends through article holders 20 and central apertures 34, being substantially surrounded by metallic source 36 so that metallic source 36 is positioned between circumferential walls 22 of article holders 20 and gas inlet pipe 38. The opposite end of gas inlet pipe 38 is connected to at least one source of gas, not shown, and preferably to a plurality of gases through a manifold. Gases from the pipe exit the pipe through pipe apertures and pass through metallic source 36. A gas outlet pipe 42 positioned in interior chamber 16 on the opposite side of article holder circumferential wall 22 from gas inlet pipe 38 provides a passageway for gases out of interior chamber 16, preferably extending through base plate 14. Outlet pipe 42 may conveniently be connected to a scrubber system.

Article holders 20, mounted atop one another in a vertical direction along their central axis, are loaded with articles 31 to be coated. Preferably, articles 31 to be coated are airfoils. The articles 31 are loaded into apertures 30 on circumferential walls 22. After loading the articles 31 into apertures 30, any remaining space is sealed with a means for sealing 44, so that once loaded, leakage across walls 22 between interior volume 26 and interior chamber 16 is minimized or eliminated.

Figure 3:
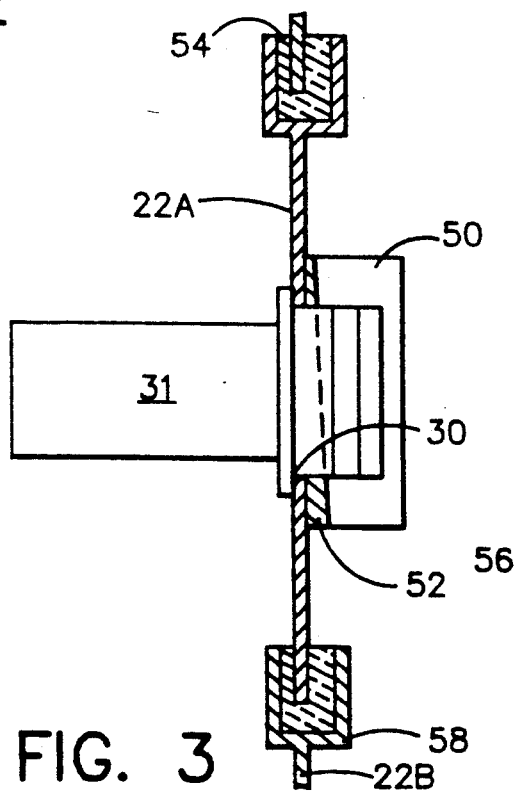
FIG. 3 is a sectional view of the cylindrical article holder in which a clamping and sealing means for holding the article in position is depicted.

Although any method of loading of articles 31 into article holders 20 and sealing with sealing means 44 may be utilized, a preferred arrangement contemplated by the present invention is shown in FIG. 3. A clamp 50 and a wedge 52 are utilized to lock an airfoil in place within an aperture 30 in circumferential wall 22. A high temperature sealant 54 capable of retaining sealing capabilities at coating temperatures and heat treating temperatures, such as a metallic oxide, for example alumina, blended with a resin such as nitrocellulose which leaves no residue, or alternatively, M-1 or M-7 which are proprietary formulations of the Alloy Surfaces Company, Inc. of Wilmington, Del. and are based on Ni, Al, Cr and their oxides may be used to prevent leakage across circumferential wall 22.

In the configuration shown, a plurality of article holders 20 are mounted using a tongue-and-groove arrangement. The circumferential wall 22A of a first article holder has a tongue which mates with a groove 58 on adjacent circumferential wall 22B of a second article holder. A high temperature sealant 54 is used to seal this arrangement, thereby preventing leakage across circumferential wall 22. In this arrangement, no intermediate cap 33 having central aperture 34 is shown, although it may be utilized with each article holder, if desired. An alternate means for joining article holders 20 together is a clamp and wedge arrangement, similar to the arrangement use to hold articles 31 within apertures 30 of circumferential walls 22.

Referring again to FIG. 2, after the article holder is loaded with articles 31, it is positioned around metallic source 36, which preferably is comprised of pellets of an aluminum-bearing material enclosed by a perforated screen. This aluminum source ideally completely surrounds gas inlet pipe 38, forming a substantially cylindrical shape, each extending from base plate 14 to top seal cap 32. Each article holder 20 is appropriately sealed. A clamping device 60 may optionally be utilized to restrain article holder 20 after loading it into retort bell 12 in order to assure it remains in a fixed position during the coating process. Clamping device 60 may optionally include top seal cap 32 or may incorporate a separate hold down means affixed to top seal cap 32.

Figure 4:
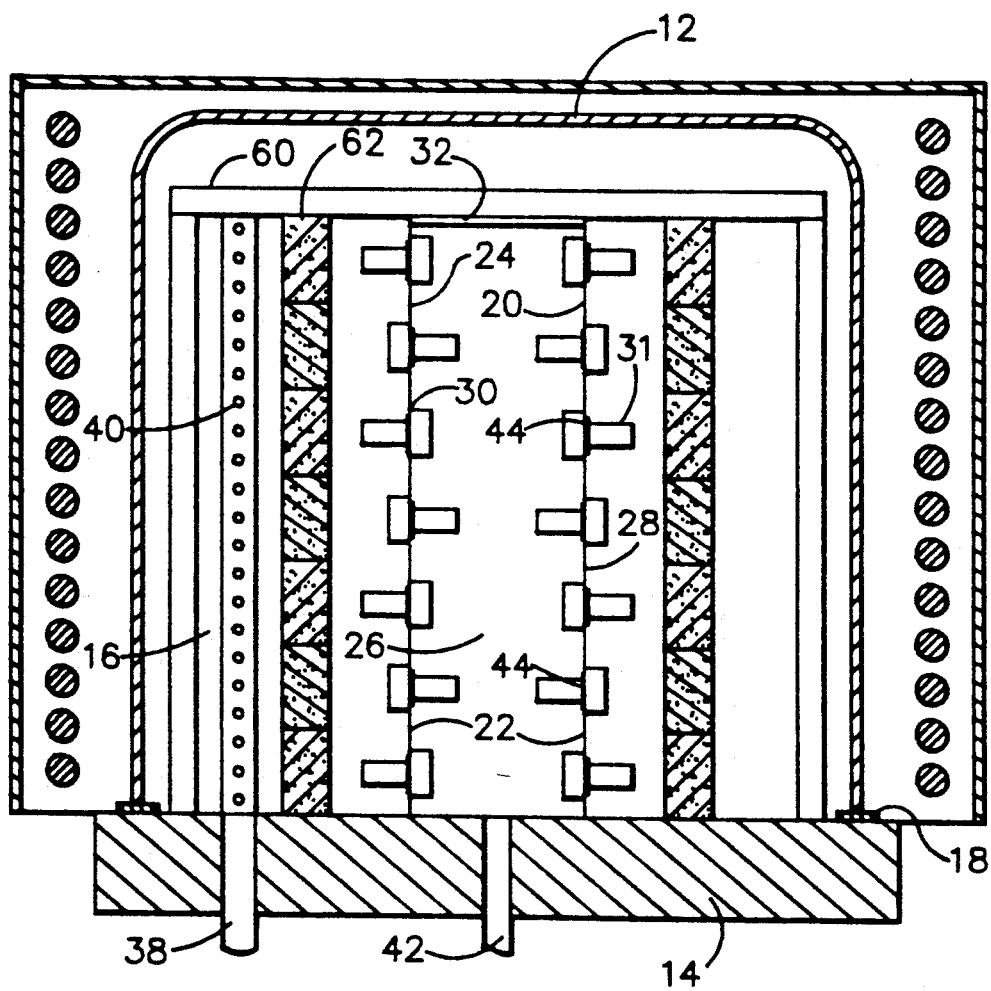
FIG. 4 is a schematic view of an alternate embodiment of the apparatus of the present invention.

Referring now to FIG. 4, in an alternate embodiment of the apparatus of the present invention, gas outlet pipe 42 is positioned within interior volume 26 of article holder 20. Metallic source 62, again surrounded by a perforated screen, which preferably contains an aluminum source, is positioned within interior chamber 16 and on second side 28 of circumferential wall 22. Gas inlet pipe 38 is also positioned within interior chamber 16 but on the exterior of article holder 20, which preferably is an airfoil holder, so that metallic source 62 is preferably positioned between it and article holder 20. In a most preferred embodiment, metallic source 62 substantially surrounds the airfoil holder. Metallic source 62 can be most effective when it extends from base plate 14 and is at least about the same height as the airfoil holder. In order to assure a more uniform distribution of inlet gas around the periphery of metallic source 62, a plurality of gas inlet pipes may be inserted through base plate 14 into interior chamber 16. Except for these modifications, the apparatus is otherwise substantially identical to that of the apparatus of the embodiment of FIG. 3.

In order to coat airfoils having internal surfaces and passageways in predetermined locations with an aluminide coating, it may first be necessary to mask those areas not requiring any coating. Then after loading the airfoil holder with airfoils, the entire retort assembly, which contains metallic source 36 as a single reaction bed of aluminum, may be sealed and then loaded into a furnace and gas inlet pipe 38 and gas outlet pipe 42 connected. The entire retort assembly may also be referred to an a reactor or a reactor assembly.

After loading the reactor into the furnace, interior chamber 16 is purged of air by introducing an inert gas into interior chamber 16 through gas inlet pipe 38 and an inert gas atmosphere is established. For the purposes of this operation, an inert gas is defined to include nitrogen and hydrogen, in addition to argon and helium. While maintaining the inert gas atmosphere within interior chamber 16, retort bell 12 is heated to an elevated, preselected temperature, typically between about 550° C. to 1200° C. (about 1000° F.–2200° F.). As is well-known in the art, the elevated temperature is selected based on coating application parameters, as will become apparent.

Upon reaching the preselected temperature, a reactive halide gas is introduced through gas inlet pipe 38. For the purposes of this operation, reactive halide gases are defined to include pure halogen gases, hydrogen halide gases, hydrogenated hydrocarbons and mixtures thereof. The halide gas flows through the reaction bed containing the aluminum source, reacting with the aluminum and forming an aluminum halide gas. The aluminum source may be any aluminum or aluminum alloy, preferably in pelletized form, for example, CoAl, FeAl, CrAl. The reaction kinetics controlling the rate of formation of the aluminum halide gas is dependent on temperature, as is well-known in the art. However, the reaction kinetics is also dependent on the partial pressure of the reactive halide gas introduced into retort bell 12. This is readily controlled by the apparatus of the present invention at a constant temperature by mixing the halide gas with inert gas to obtain and maintain the desired partial pressure of halide gas, or by varying the partial pressure of halide gas, as desired. This, in turn controls the rate of deposition of coating upon the airfoils, and hence the coating thickness.

As the aluminum halide gas flows over the surfaces of the airfoils, the aluminum halide gas is reduced to aluminum, thereby coating the surfaces. Of course, the rate of deposition depends upon the partial pressure of gas, as previously discussed. Masked surfaces will not have coating deposits. It has also been observed that a laminar flow of gas can result in an uneven flow of gas over the surfaces of the airfoil, creating a stagnant boundary layer and preventing the desired coating deposit. However, by regulating the gas flow rate into interior chamber, turbulent flow can be maintained and a stagnant boundary layer can be prevented from forming.

In order to force the aluminum halide gas through the narrow interior passages of the airfoils, a certain minimum pressure of gas is required. Thus, the inert gas not only can be used to control the partial pressure of reactive gas, and hence reduction of aluminum halide gas at the surface, but it can also be balanced to provide the necessary pressure to force the aluminum halide gas through the internal passageways of the airfoils, thereby coating them. After passing through the airfoils to the opposite side of circumferential wall 22, remaining aluminum halide gas is deposited on the airfoil surfaces on that side of circumferential wall 22, before being exhausted from retort bell 12 through gas outlet pipe 42.

Upon completion of the coating operation, the reactor may be removed form the furnace and cooled or optionally furnace cooled, while maintaining an inert gas atmosphere if desired. However, once the desired coating thickness has been obtained, the flow of reactive halide gasses through gas inlet pipe 38 may be stopped, and inert gas is flowed through inlet pipe 38 to reestablish an inert gas atmosphere within interior chamber 16 at the preselected coating temperature. No further coating of the airfoils will occur. The airfoils may then be raised to a second preselected temperature for heat treatment while maintaining the inert gas atmosphere, and subsequently cooled.

Although the present invention has been described in connection with specific examples and embodiments, it will be understood by those skilled in the arts involved, that the present invention is capable of modification without departing from its spirit and scope as represented by the appended claims.

I claim:

1. Apparatus for coating a plurality of articles, each article having at least one internal passage extending from a first surface to a second surface, by generating a coating gas which simultaneously coats the passages and the surfaces, comprising:
    a base plate;
    a retort bell which seats on the base plate, the interior of the bell and the base plate forming an interior chamber;
    a seal between the retort bell and the base plate;
    at least one substantially cylindrical article holder positioned within the retort bell interior chamber, the substantially cylindrical article holder having a circumferential wall having two sides, the first side defined by a first radius forming an interior volume within the substantially cylindrical article holder, and a second side defined by a second radius larger than the first radius forming an exterior of the cylindrical article holder, the circumferential wall further having a plurality of apertures for holding the articles in a fixed position;
    a gas inlet pipe extending into the interior chamber of the retort bell positioned on one side of the circumferential wall of the article holder;
    a gas outlet pipe from the interior chamber of the retort bell for exhausting gases positioned on the opposite side of the circumferential wall of the cylindrical article holder from the gas inlet pipe;
    means for sealing a space between the circumferential wall and the articles positioned within the apertures of the circumferential wall; and
    a metallic source positioned within the retort bell interior chamber between the gas inlet pipe and the circumferential wall of the substantially cylindrical article holder.

2. The apparatus of claim 1 wherein the article holder includes a removable top seal cap to minimize leakage between the interior volume and the interior chamber.

3. The apparatus of claim 1 further comprising a plurality of substantially cylindrical article holders having circumferential walls adjacently mounted in a vertical direction along a central axis; and means for sealing the circumferential walls of adjacent holders.

4. The apparatus of claim 3 further including a clamping device to position the article holders within the retort bell interior chamber.

5. The apparatus of claim 3 wherein each substantially cylindrical article holder includes a removable top seal cap.

6. The apparatus of claim 1 wherein the metallic source are pellets of an aluminum-bearing material enclosed by a perforated screen.

7. A reactor for coating a plurality of hollow airfoils, each airfoil having internal passages, by generating an aluminum coating gas which simultaneously coats the airfoil and its internal passages, comprising:
   a base plate;
   a retort bell which seats on the base plate, the interior of the bell and the base plate forming an interior chamber;
   a seal between the retort bell and the base plate;
   at least one substantially cylindrical airfoil holder positioned within the retort bell interior chamber, the article holder having a circumferential wall having two sides, the first side defined by a first radius forming an interior volume within the substantially cylindrical airfoil holder, a second side defined by a second radius larger than the first radius, forming an exterior of the substantially cylindrical airfoil holder, the circumferential wall further having a plurality of apertures for holding the airfoils in fixed position;
   a gas inlet pipe extending into the interior chamber of the retort bell positioned on one side of the circumferential wall of the airfoil holder;
   a gas outlet pipe extending from the interior chamber of the retort bell for exhausting gas to the outside of the retort bell, positioned on the opposite side of the circumferential wall of the substantially cylindrical airfoil holder form the gas inlet pipe;
   means for sealing a space between the circumferential wall and the airfoils positioned within the apertures of the circumferential wall; and
   an aluminum source positioned within the retort bell interior chamber between the gas inlet pipe and the circumferential wall of the substantially cylindrical airfoil holder.

8. The reactor of claim 7 wherein the airfoil holder includes a removable top seal cap.

9. The reactor of claim 7 further comprising a plurality of substantially cylindrical airfoil holders having circumferential walls adjacently mounted in a vertical direction along a central axis; and
   means for sealing the circumferential walls of adjacent holders.

10. The airfoil holders of claim 9 wherein the means for sealing includes a tongue-and-groove arrangement between mating surfaces of circumferential walls of adjacent holders.

11. The reactor of claim 7 wherein the aluminum source is enclosed by a perforated screen.

12. The reactor of claim 11 wherein the gas inlet pipe is centrally located within the interior volume of the circumferential wall, and wherein the gas pipe includes a plurality of perforations.

13. The reactor of claim 12 wherein the gas inlet pipe extends along an axis of the airfoil holder from the base plate to the top seal cap.

14. The reactor of claim 12 wherein the aluminum source has a cylindrical shape which surrounds the gas inlet pipe, extending from the base plate to the top seal cap.

15. The reactor of claim 7 further including means to maintain the cylindrical airfoil holder in fixed relationship to the base plate.

16. The reactor of claim 15 wherein the means includes a clamping device.

17. The reactor of claim 7 wherein the gas inlet pipe is located on the exterior of the cylindrical airfoil holder.

18. The reactor of claim 17 wherein the aluminum source is enclosed by a perforated screen and surrounds the airfoil holder.

19. The reactor of claim 18 wherein the aluminum source extends from the base plate and has about the same height as the airfoil holder.

* * * * *